(12) United States Patent
Ahlstedt

(10) Patent No.: US 9,343,636 B2
(45) Date of Patent: May 17, 2016

(54) WAVELENGTH CONVERSION ELEMENT, LIGHT-EMITTING SEMICONDUCTOR DEVICE AND DISPLAY APPARATUS THEREWITH, AND METHOD FOR PRODUCING A WAVELENGTH CONVERSION ELEMENT

(71) Applicant: OSRAM Opto Semicondusctors GmbH, Regensburg (DE)

(72) Inventor: Mikael Ahlstedt, München (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 14/383,247

(22) PCT Filed: Mar. 5, 2013

(86) PCT No.: PCT/EP2013/054384
§ 371 (c)(1),
(2) Date: Sep. 5, 2014

(87) PCT Pub. No.: WO2013/131904
PCT Pub. Date: Sep. 12, 2013

(65) Prior Publication Data
US 2015/0048392 A1    Feb. 19, 2015

(30) Foreign Application Priority Data
Mar. 6, 2012  (DE) .......................... 10 2012 101 892

(51) Int. Cl.
*H01L 33/50*  (2010.01)
*C04B 37/00*  (2006.01)
(Continued)

(52) U.S. Cl.
CPC .............. *H01L 33/504* (2013.01); *C04B 37/00* (2013.01); *C04B 37/008* (2013.01); *C09K 11/025* (2013.01); *H01L 25/13* (2013.01); (Continued)

(58) Field of Classification Search
IPC ................ H01L 33/504, 33/505, 37/00, 37/008, H01L 2924/0002, 2924/00; C09K 11/025
See application file for complete search history.

(56) References Cited

U.S. PATENT DOCUMENTS

| 2007/0215890 A1 | 9/2007 | Harbers et al. |
| 2008/0048200 A1 | 2/2008 | Mueller et al. |

(Continued)

FOREIGN PATENT DOCUMENTS

| DE | 10 2006 037 730 | 2/2008 |
| DE | 10 2009 005 907 | 7/2010 |

(Continued)

OTHER PUBLICATIONS

Schnitzer, et al., "30% external quantum efficiency from surface textured, thin-film light-emitting diodes," Applied Physics Letters, vol. 63, No. 16, Oct. 18, 1993, p. 2174-2176

*Primary Examiner* — Yasser A Abdelaziez
(74) *Attorney, Agent, or Firm* — DLA Piper LLP (US)

(57) ABSTRACT

A wavelength conversion element including at least two ceramic conversion segments each including a ceramic wavelength conversion substance and connected together in a matrix by a non-transparent connecting material, wherein each conversion segment emits light by absorbing primary radiation and re-emitting secondary radiation different from the primary radiation, and the light comprises the secondary radiation and a proportion of the primary radiation is less than or equal to 5%.

15 Claims, 3 Drawing Sheets

(51) Int. Cl.
*C09K 11/02* (2006.01)
*H01L 25/13* (2006.01)

(52) U.S. Cl.
CPC .......... *H01L 33/505* (2013.01); *C04B 2237/04* (2013.01); *C04B 2237/12* (2013.01); *H01L 2924/0002* (2013.01); *H01L 2933/0041* (2013.01); *Y10T 428/249984* (2015.04)

(56) References Cited

U.S. PATENT DOCUMENTS

| | | | |
|---|---|---|---|
| 2008/0217636 A1* | 9/2008 | Bechtel | H01L 33/505 257/98 |
| 2008/0232420 A1 | 9/2008 | Brunner et al. | |
| 2009/0050919 A1* | 2/2009 | Weijers | H01L 33/504 257/98 |
| 2012/0007131 A1* | 1/2012 | Ueno | H01L 33/508 257/98 |
| 2014/0001503 A1 | 1/2014 | Ahlstedt et al. | |

FOREIGN PATENT DOCUMENTS

| | | |
|---|---|---|
| DE | 10 2009 037 186 | 2/2011 |
| DE | 10 2010 028 776 | 11/2011 |
| DE | 10 2010 048 162 | 4/2012 |
| WO | 2007/102095 | 9/2007 |
| WO | 2010/072191 | 7/2010 |
| WO | 2011/039052 | 4/2011 |
| WO | 2011/097137 | 8/2011 |

* cited by examiner

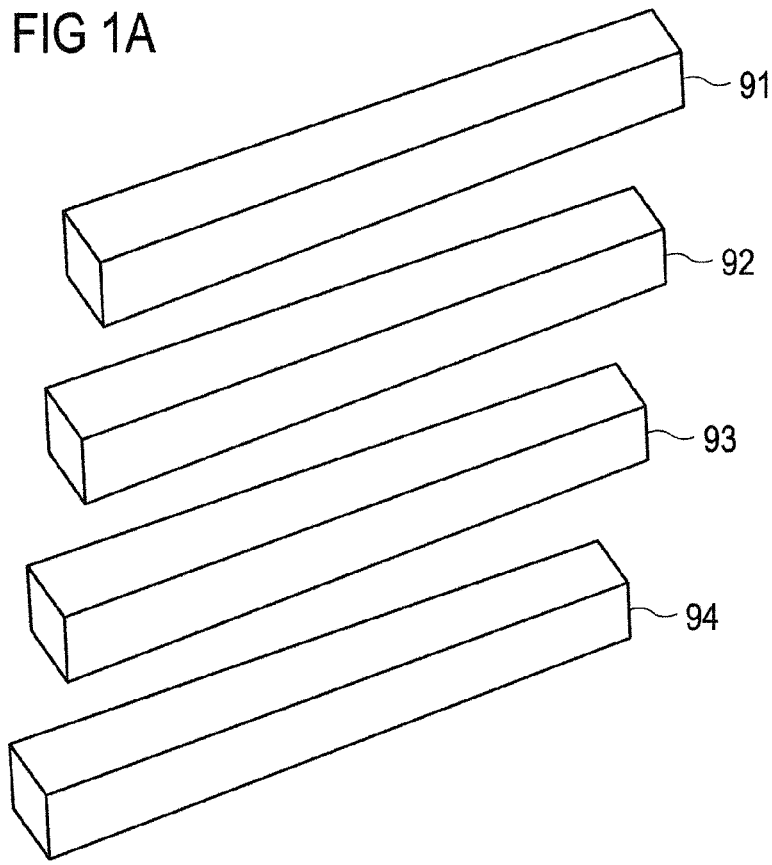
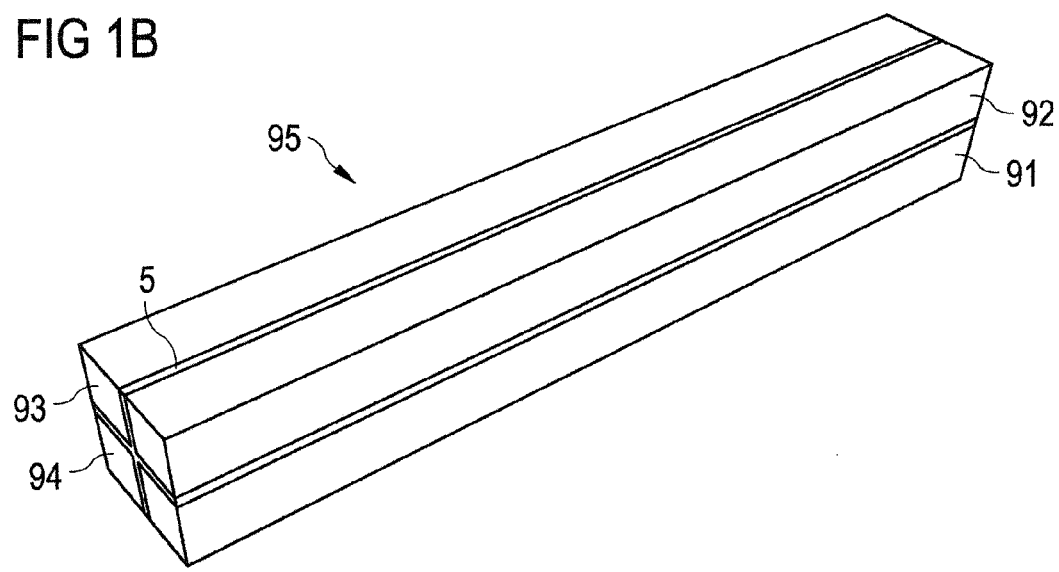

WAVELENGTH CONVERSION ELEMENT, LIGHT-EMITTING SEMICONDUCTOR DEVICE AND DISPLAY APPARATUS THEREWITH, AND METHOD FOR PRODUCING A WAVELENGTH CONVERSION ELEMENT

TECHNICAL FIELD

This disclosure relates to a wavelength conversion element, a method of producing a wavelength conversion element, a light-emitting semiconductor device and a display apparatus having a wavelength conversion element.

BACKGROUND

To achieve multi-colored applications using light-emitting diodes (LEDs), currently, individual LED chips having different emission colors are typically combined, e.g. red-, green- and blue-emitting LED chips, or colored-light emitting LED chips are used in combination with so-called "conversion" LEDs having a luminescent substance for color conversion. Those approaches enable different mixed colors as well as white, e.g., warm-white, light to be produced. By controlling the respectively emitted intensity of the individual LED chips of such a combination of a plurality of LED chips, mixing of the individual colors produced by the LED chips and thus the mixed color emitted by the combination can be controlled. The use of a plurality of LED chips to produce mixed-color or white light or achieve light varying in color is, however, associated with high costs due to the use of a plurality of LED chips.

It could therefore be helpful to provide a wavelength conversion element for a light-emitting semiconductor device, a method of producing a wavelength conversion element, a light-emitting semiconductor device and a display apparatus having a wavelength conversion element.

SUMMARY

I provide a wavelength conversion element comprising at least two ceramic conversion segments each comprising a ceramic wavelength conversion substance and connected together in a matrix by a non-transparent connecting material, wherein each conversion segment emits light by absorbing primary radiation and re-emitting secondary radiation different from the primary radiation, and the light comprises the secondary radiation and a proportion of the primary radiation is less than or equal to 5%.

I also provide a method of producing a wavelength conversion element, comprising providing at least two ceramic bars with mutually different ceramic wavelength conversion substances, wherein the at least two bars are connected along their main extension direction by the non-transparent connecting material to form a bar composite so that the non-transparent connecting material is arranged between lateral surfaces of the bars, and severing the bar composite perpendicular to the main extension direction to form individual wavelength conversion elements, wherein upon severing, the conversion segments are formed from the bars.

I further provide a light-emitting semiconductor device having a light-emitting semiconductor chip which during operation emits blue and/or ultraviolet primary radiation via a light coupling-out surface along an emitting direction, and having a wavelength conversion element, wherein the conversion segments are arranged laterally next to each other on the light coupling-out surface.

I still further provide a display apparatus having a multiplicity of light-emitting semiconductor devices, wherein each of the semiconductor devices forms a pixel of the display apparatus.

BRIEF DESCRIPTION OF THE DRAWINGS

FIGS. 1A to 1C show schematic illustrations of a method of producing a wavelength conversion element in accordance with one example.

DETAILED DESCRIPTION

Figure 1C:
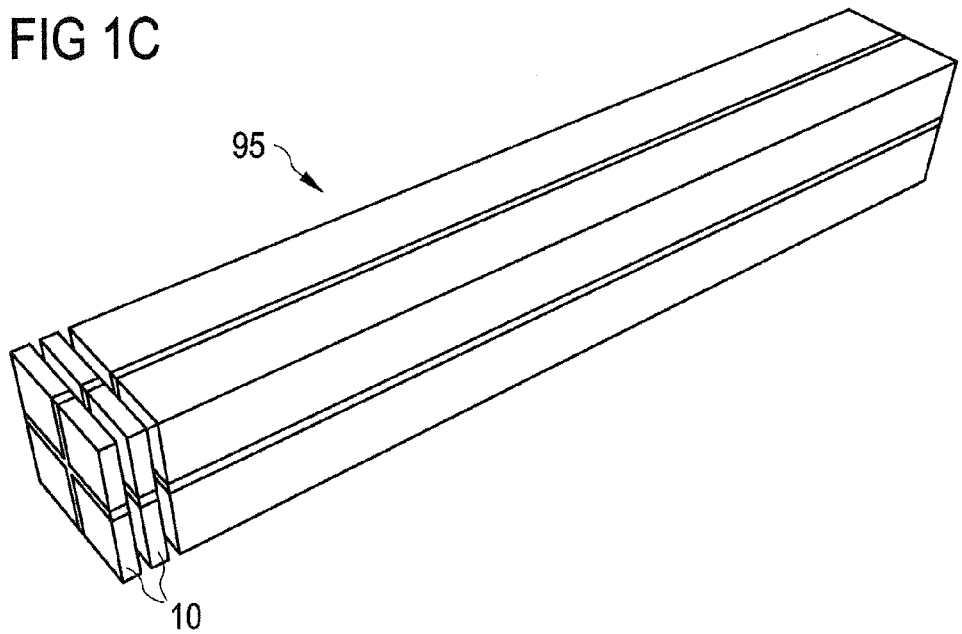

My wavelength conversion elements may comprise at least two ceramic conversion segments. Each of the conversion segments is formed by a layer consisting of a ceramic material having a ceramic wavelength conversion substance.

The conversion segments can be formed preferably in a plate-like manner so that the respective layer consisting of the ceramic material has a main extension plane. Each of the conversion segments has a thickness perpendicular to the main extension plane, wherein the thickness can preferably be less than or equal to the dimensions of a conversion segment along the main extension plane. It is also possible that the thickness of a conversion segment exceeds the dimensions thereof in the main extension plane.

The phrase "layer consisting of a ceramic material" means a layer which for the most part comprises a ceramic. "For the most part" means that the ceramic takes up a weight proportion of more than 50%, in particular of more than 75% and preferably of more than 90% of the weight of the layer consisting of the ceramic material. Frequently, the layer consisting of the ceramic material also consists of the ceramic. A "ceramic" means an oxide-containing or a nitride-containing material, wherein materials which only have a short-range order and not a long-range order are also included by the term "ceramic". Accordingly, inorganic glasses are also included by the phrase "ceramic" or "ceramic material".

Each of the conversion segments emits light by absorption of primary radiation and re-emission of secondary radiation different from the primary radiation. The ceramic wavelength conversion substance of each conversion element can comprise or consist of one or more wavelength conversion substances suitable to absorb the primary radiation and re-emit secondary radiation.

Particularly preferably, the conversion segments each effect full conversion of the primary radiation. This means that the light produced by irradiation of primary radiation onto a conversion segment is formed substantially by the secondary radiation. In addition, the light emitted by the conversion segment can still have a proportion of the primary radiation of less than or equal to 5% and preferably of less than or equal to 2%. In other words, the conversion segments emit light, upon the irradiation of the primary radiation, which is formed by the converted respective secondary radiation and the proportion of the primary radiation of less than or equal to 5% and in a particularly preferred manner of less than or equal to 2%. Particularly preferably, the primary radiation cannot be perceived by an observer in the light emitted by the conversion segments in each case. For this purpose, the conversion segments can have a sufficiently high density of the respective wavelength conversion substance and/or a sufficiently high thickness of greater than or equal to a critical thickness at which the stated full conversion is achieved. In particular, all the conversion segments of the wavelength conversion element can have the same thickness so that the wavelength conversion element can have a uniform thickness over all the conversion segments.

Due to the full conversion property of the conversion segments, it can advantageously be achieved that a thickness variation in a conversion segment having a thickness above the respective critical thickness no longer influences the light emitted by the conversion segment with respect to its perceived color. In particular, it can be advantageous if the thickness is selected to be close to the respective critical thickness to avoid non-radiating de-excitations, absorption losses and scattering losses which can increase as the thickness increases.

The ceramic wavelength conversion substance of a conversion segment can comprise or be formed of, for example, at least one or more of the following materials for wavelength conversion: garnets doped with rare earth metals, alkaline earth sulphides doped with rare earth metals, thiogallates doped with rare earth metals, aluminates doped with rare earth metals, silicates doped with rare earth metals such as orthosilicates, chlorosilicates doped with rare earth metals, alkaline earth silicon nitrides doped with rare earth metals, oxynitrides doped with rare earth metals and aluminum oxynitrides doped with rare earth metals, silicon nitrides doped with rare earth metals, sialons.

Preferably, the ceramic wavelength conversion substance used can be in particular garnets such as yttrium aluminum oxide (YAG), lutetium aluminum oxide (LuAG) and terbium aluminum oxide (TAG).

The materials for the ceramic wavelength conversion substance are, further preferably, doped, for example, with one of the following activators: cerium, europium, neodymium, terbium, erbium, praseodymium, samarium, manganese. Included purely by way of example for possible doped ceramic wavelength conversion substances are cerium-doped yttrium aluminum garnets, cerium-doped lutetium aluminum garnets, europium-doped orthosilicates and europium-doped nitrides.

The ceramic material of a conversion segment can also comprise, in addition to the ceramic wavelength conversion substance, further, in particular inorganic particles which preferably do not have any wavelength-converting properties. For example, nitrides and oxides of the elements aluminum, boron, titanium, zirconium and silicon or mixtures of two or more of the materials can be considered as the further particles.

The respective ceramic material of the conversion segments comprises in particular a ceramic wavelength conversion substance in the form of particles connected to each other and/or to further particles to form the ceramic material. The layer consisting of the ceramic material of one or more conversion segments can, for example, also consist of the respective ceramic wavelength conversion substance.

The conversion segments may absorb blue and/or ultraviolet primary radiation. Particularly preferably, the conversion segments absorb blue primary radiation, for example, having an average wavelength of 460 nm. The wavelength conversion element can comprise at least one conversion segment to re-emit red secondary radiation. A further conversion segment can re-emit green secondary radiation. Furthermore, the wavelength conversion element can comprise a conversion segment that re-emits yellow secondary radiation. Moreover, the wavelength conversion element can comprise a conversion segment that re-emits blue secondary radiation different from the primary radiation. Conversion segments re-emitting red or yellow secondary radiation also include those emitting orange or reddish-orange (amber) secondary radiation.

Particularly preferably, the wavelength conversion element comprises a conversion segment which, as the ceramic wavelength conversion substance, comprises SrSiON:Eu that re-emits green secondary radiation, Ca—SiAlON that re-emits reddish-orange (amber) secondary radiation, YAG:Ce that re-emits yellow secondary radiation or $(Ca, Sr)_2Si_5N_8$:Eu that re-emits red secondary radiation. In particular, such conversion segments can be combined in the wavelength conversion element.

Particularly preferably, the wavelength conversion element comprises a conversion segment that re-emits red secondary radiation, a conversion segment that re-emits green secondary radiation and a conversion element that re-emits blue secondary radiation. Further particularly preferably, the wavelength conversion element additionally also comprises a conversion segment that re-emits yellow secondary radiation. Further particularly preferably, the wavelength conversion element comprises a combination of the conversion segments without a conversion segment which re-emits blue.

In the case that the conversion element does not comprise a conversion segment that re-emits blue, the wavelength conversion element can comprise a transparent segment formed, for example, by a recess, the shape of which corresponds, for example, to the shape of the conversion segment. Furthermore, the transparent segment can be formed, instead of the recess, by a transparent material, e.g., glass or a ceramic material, for instance undoped YAG, or sapphire. A wavelength conversion element having a transparent segment, in the case of an arrangement on a light-emitting semiconductor chip that emits blue primary radiation can advantageously result in the fact that the blue primary radiation can be emitted by the transparent segment directly and in addition to the secondary radiation emitted by the conversion segments in each case.

The wavelength conversion element may comprise a non-transparent connecting material by which the ceramic conversion segments connect to each other. In particular, the conversion segments can be arranged in a matrix-like manner and can connect together. This can mean in particular that the conversion segments, which—as described above—can be formed in a plate- or layer-like manner, are arranged next to each other along their main extension plane. In other words, the conversion segments can be arranged next to each other in a tile-like manner. The connecting material can be arranged in particular between two adjacent conversion elements in a joint-like manner. The non-transparent connecting material can ensure in particular that the conversion segments are permanently held together so that the wavelength conversion element having the at least two ceramic conversion segments forms a self-supporting unit which can be provided and processed without any additional carriers or any additional substrate.

By virtue of the fact that the connecting material is non-transparent, crosstalk of the secondary radiation of one conversion segment into another conversion segment can be prevented. Particularly preferably, the non-transparent connecting material can be reflective to reflect secondary radiation produced in a conversion segment back into same.

The connecting material may comprise a base material formed by an organic material and/or a ceramic. The organic material can be, for example, a synthetic material, for instance silicone or epoxide. The ceramic can be, for example, $SiO_2$, $TiO_2$ or one of the ceramics mentioned above which do not have any wavelength conversion properties. For its part, the base material can be non-transparent. Alternatively, the base material can also be at least partially transparent per se. In particular, in this case, the base material comprises an admixture of a further material, e.g., in the form of particles, which ensures that the connecting layer is non-transparent.

The base material may comprise radiation-reflecting particles arranged in the base material and have a refractive index different from that of the base material, preferably a refractive index greater than that of the base material. Instead of or in addition to the particles, the base material can also comprise pores, for example, air-filled pores. In the case of radiation-reflecting particles, these can preferably have an optical refractive index of greater than or equal to 1.8. A refractive index range such as this for the radiation-reflecting particles has proven to be particularly advantageous in view of the radiation-reflecting properties of the connecting material.

The radiation-reflecting particles may be formed from at least one of the materials $TiO_2$, $ZrO_2$, $ZnO$, $Al_2O_3$, $BaSO_4$, $MgO$, $Ta_2O_5$, $HfO_2$, $Gd_2O_3$, $Nb_2O_3$, $Y_2O_3$ or contain at least one or more of these materials. The concentration of the radiation-reflecting particles in the base material can preferably be greater than or equal to 10 wt. % and preferably be greater than or equal to 20 wt. %. The radiation-reflecting particles can be distributed within the base material in a preferably uniform manner. The base material and the radiation-reflecting particles can be selected such that the connecting material appears white to an observer owing to its reflective properties, since preferably the entire color spectrum of the ambient light is reflected by the connecting material. Alternatively, it is also possible that the connecting material appears to be a different color to an observer and reflects one or more colors. Furthermore, it can also be possible that the connecting material comprises, for example, non-reflecting, in particular absorbing, particles or materials, e.g., carbon black.

The non-transparent connecting material may comprise a metallic material or may be formed by a metal. For example, the metal is Ag and/or Al or a mixture or alloy therewith. A connecting material formed of such a metal can advantageously be reflective for the secondary radiation produced in the conversion segments.

Furthermore, it is also possible that the connecting material is formed as a photonic crystal, wherein the photonic crystal can be formed having at least one one-, two- and/or three-dimensional photonic bandgap structure. "One-dimensional" can mean that the photonic crystal is formed in the form of a layer. "Two-dimensional" can mean that the photonic crystal can be formed in the form of tubes or rods. Accordingly, "three-dimensional" can mean that the photonic crystal is formed with spherical structures. For example, the photonic crystal can be formed having at least two materials that are different e.g., in terms of their respective optical reflection coefficient, for example, organic materials or ceramics. The at least two different materials can be arranged one after the other in a periodically alternating manner along a predeterminable (preferential) direction. Furthermore, it is possible that the connecting material is formed as a photonic crystal having pores in a ceramic and/or a glass-containing material. As a result, for example, a three-dimensional photonic bandgap structure can be achieved. The pores are preferably surrounded completely by the ceramic and/or the glass-containing material and are filled, for example, with air. For example, the ceramic is formed with at least one of the materials $SiO_2$, $TiO_2$ or a mixture of $SiO_2$ and $TiO_2$.

In the case of a method of producing a wavelength conversion element, at least two ceramic bars may be provided which each comprise a ceramic wavelength conversion substance, preferably mutually different wavelength conversion substances. In particular, the number of ceramic bars which can be provided is the same as the number of conversion segments which the wavelength conversion element is to comprise.

To produce the ceramic bars, a ceramic having the respective ceramic wavelength conversion substance can be provided in the form of a granulate or powder, which is mixed for example, with a binder and/or a solvent, which is then sintered in an appropriate form. For example, the ceramic material can be sintered in bar-form or sintered in plate-form and then separated to form individual bars by sawing, breaking or similar separation methods.

In a further method step, the at least two bars may be connected along their main extension direction by the non-transparent connecting material to form a bar composite. In other words, the bars are joined together with lateral surfaces extending along the main extension direction so that the non-transparent connecting material is arranged between the lateral surfaces of the bars. The connecting material can be sintered, for example, together with the ceramic bars. This can be the case in particular when the connecting material comprises a ceramic or a metallic material. Alternatively, it is also possible that the at least two ceramic bars are first completed and then connected to the connecting material to form the bar composite, in particular in the case that the connecting material comprises an organic material, for example, a synthetic material. The bar composite preferably has a cross-sectional surface perpendicular to the main extension direction of the individual ceramic bars, which surface corresponds to a light coupling-out surface of a light-emitting semiconductor chip, on which a wavelength conversion element—which is completed subsequently—is to be arranged.

The bar composite may be severed perpendicular to the main extension direction of the individual ceramic bars to form individual wavelength conversion elements, wherein upon being severed the conversion segments of the wavelength conversion elements are formed from the respective ceramic bars of the bar composite. Severing can be effected, for example, by sawing.

Preferably, four ceramic bars having a respective cross section of 500 μm×500 μm are connected by a connecting material in a 2×2 matrix to form a bar composite with a cross section of for instance 1000 μm×1000 μm. The wavelength conversion elements separated therefrom have a similar cross section and can be applied, for example, on semiconductor chips having a light coupling-out surface with such a cross section.

Furthermore, it is also possible that, for example, instead of at least one ceramic bar having a ceramic wavelength conversion substance, a bar consisting of a transparent ceramic or glass-like material, as described above, is provided to produce wavelength conversion elements having a transparent segment formed by the transparent material in addition to the conversion elements. Furthermore, it is also possible to leave, in the bar composite, the position of a bar free in order to produce wavelength conversion elements having a transparent segment formed by a recess.

The examples and features described in conjunction with the wavelength conversion element apply accordingly for the method of producing a wavelength conversion element, and vice versa.

A light-emitting semiconductor device may comprise the wavelength conversion element on a light-emitting semiconductor chip. The light-emitting semiconductor chip can emit in particular blue and/or ultraviolet primary radiation via a light coupling-out surface along an emitting direction. The wavelength conversion element is applied, e.g., adhered, onto the light coupling-out surface of the light-emitting semiconductor chip such that the conversion segments are arranged laterally next to each other on the light coupling-out surface, wherein "laterally" refers to a direction perpendicular to the emitting direction.

The light-emitting semiconductor chip may have an active region that emits light during operation of the semiconductor chip. The light-emitting semiconductor chip be produced, depending upon the desired wavelength to be emitted, as a semiconductor layer sequence on the basis of different semiconductor material systems. For short-wave visible, i.e., in particular blue, primary radiation and/or for ultraviolet primary radiation, a semiconductor layer sequence on the basis of $In_xGa_yAl_{1-x-y}N$ is particularly suitable, wherein $0 \leq x \leq 1$ and $0 \leq y \leq 1$.

In particular, the light-emitting semiconductor chip can comprise or consist of a semiconductor layer sequence, particularly preferably an epitaxially grown semiconductor layer sequence. For this, the semiconductor layer sequence can be grown on a growth substrate by means of epitaxial growth method, e.g., metalorganic vapor phase epitaxy (MOVPE) or molecular beam epitaxy (MBE), and can be provided with electrical contacts. By separating the growth substrate with the grown semiconductor layer sequence, a plurality of light-emitting semiconductor chips can be provided.

Furthermore, the semiconductor layer sequence can be transferred to a carrier substrate prior to separation and the growth substrate can be thinned or completely removed. Such semiconductor chips which, as a substrate, comprise a carrier substrate instead of the growth substrate, can also be referred to as so-called "thin-film" semiconductor chips.

A thin-film semiconductor chip is particularly characterized by the following characteristic features:

on a first main surface of a radiation-producing epitaxial layer sequence facing the carrier substrate, a reflective layer is applied or formed and reflects at least a portion of the electromagnetic radiation produced in the epitaxial layer sequence back into same;

the epitaxial layer sequence has a thickness of 20 µm or less, in particular 4 µm to 10 µm; and the epitaxial layer sequence contains at least one semiconductor layer having at least one surface having a mixed structure which ideally results in an approximately ergodic distribution of the light in the epitaxial layer sequence, that is to say it has a scattering behavior which is as ergodically stochastic as possible.

A thin-film semiconductor chip is, in a good approximation, a Lambertian surface emitter. The basic principle of a thin-layer light-emitting diode chip is described, for example, in I. Schnitzer et al., *Appl. Phys. Lett.* 63 (16), 18 Oct. 1993, 2174-2176.

The light-emitting semiconductor chip may comprise several luminescent segments which can be actuated in a mutually independent manner. The luminescent segments, which each emit the primary radiation during operation of the light-emitting semiconductor device over an emission region of the light coupling-out surface, can be produced, for example, by segmenting or structuring at least one electrical contact surface of the semiconductor chip. Furthermore, individual or several semiconductor layers, e.g., the active layer, of the semiconductor chip can also be structured. Segmented light-emitting semiconductor chips are known, for example, from WO 2010/072191 and WO 2011/039052, the subject matter of which is incorporated by reference.

Each conversion segment of the wavelength conversion element may be disposed downstream of a luminescent segment of the light-emitting semiconductor chip in the emitting direction. In particular, a conversion segment of the wavelength conversion element can be disposed downstream of each of the luminescent segments of the semiconductor chip so that each of the luminescent segments emits light, over its emission region of the light coupling-out surface, into the conversion segment disposed downstream in each case. Furthermore, it is also possible that, for example, a transparent segment and not a conversion segment is disposed downstream of a luminescent segment so that this luminescent segment is not covered by the wavelength conversion element and can emit light directly through the transparent segment.

By segmenting the light-emitting semiconductor chip and arranging the wavelength conversion element such that the individual conversion segments are each disposed downstream of a luminescent segment, the light-emitting semiconductor device can emit light with an adjustable color by actuating, in a targeted manner, the individual luminescent segments.

A large number of semiconductor devices can be arranged as part of a display apparatus, e.g., in the form of a display or display panel, in a matrix, wherein each semiconductor device can form an individual pixel. It is particularly advantageous if the light-emitting semiconductor chips comprise luminescent substances which can be actuated in a mutually independent manner, as described above, so that each pixel of the display apparatus can be actuated individually in terms of its color. As a result, compared to typical display applications having a plurality of differently-colored light-emitting diode chips per pixel, a higher density of pixels and thus a higher resolution, e.g., in the form of a high-definition (HD) resolution, can be achieved.

Further advantages and developments will be apparent from the examples described hereinafter in conjunction with the figures.

Like or similar elements or elements acting in an identical manner can each be provided with like reference numerals in the examples and figures. The illustrated elements and their size ratios with respect to each other are not to be regarded as being to scale, rather individual elements such as, for example, layers, components, devices and regions, may be illustrated excessively large to provide a clearer illustration and/or for greater ease of understanding.

FIGS. 1A to 1C illustrate a method of producing wavelength conversion elements in accordance with one example.

In a first method step in accordance with FIG. 1A, ceramic bars 91, 92, 93, 94 each consisting of a ceramic material are provided. The ceramic bars 91, 92, 93, 94 each comprise in particular a ceramic material including a ceramic wavelength conversion substance in each case. The respective ceramic material can be mixed, e.g., in the form of a granulate or powder, with a binder and/or a solvent and be formed in the form of plates or in the form of the illustrated bars. The ceramic bars 91, 92, 93, 94 can be sintered prior to the further method steps or only after being joined together to form a bar composite 95, as shown in conjunction with FIG. 1B. If plates are provided with the respective ceramic material, then these are then split into individual bars, e.g., by sawing or cutting.

As an alternative to the illustrated four ceramic bars 91, 92, 93, 94, more or fewer, but at least two, ceramic bars can be provided. For example, the ceramic bar 91 can comprise a ceramic wavelength conversion substance which can convert blue primary radiation into red secondary radiation. The ceramic bar 92 can comprise a ceramic wavelength conversion substance which can convert blue primary radiation into green secondary radiation. The ceramic rod 93 can comprise a ceramic wavelength conversion substance which can convert blue primary radiation into yellow secondary radiation. The ceramic rod 94 can comprise a ceramic wavelength conversion substance which can convert blue primary radiation into blue secondary radiation which differs therefrom. Alternatively, other combinations of wavelength conversion substances are also possible. SrSiON:Eu can be used, for example, as a green-emitting wavelength conversion substance, Ca—SiAlON can be used, for example, as a reddish-orange-(amber-)emitting wavelength conversion substance, YAG:Ce can be used, for example, as a yellow-emitting wavelength conversion substance and $(Ca, Sr)_2Si_5N_8$:Eu can be used, for example, as a red-emitting wavelength conversion substance. Alternatively or in addition, the ceramic bars 91, 92, 93, 94 can also comprise other wavelength conversion substances mentioned above in the general part.

The ceramic bars 91, 92, 93, 94 each have a main extension direction and a cross section perpendicular thereto, wherein the respective cross section in the illustrated example is quadratic and has side lengths of about 500 μm. Alternatively, other cross-sectional shapes and dimensions are possible.

As shown in FIG. 1B, the four ceramic bars 91, 92, 93, 94 connect along their main extension direction by a non-transparent connecting material 5 to form a bar composite 95. In other words, the non-transparent connecting material 5 connects lateral surfaces of adjacent ceramic bars 91, 92, 93, 94 to each other. The thus produced bar composite 95 has, in the illustrated example, a cross section having side lengths of about 1000 μm perpendicular to the main extension direction of the individual ceramic bars 91, 92, 93, 94.

The non-transparent connecting material 5 is preferably formed to be reflective and, in the illustrated example, comprises an organic or ceramic base material containing radiation-reflecting particles which have a refractive index different from that of the base material. For example, the radiation-reflecting particles are formed with at least one of the materials $TiO_2$, $ZrO_2$, ZnO, $Al_2O_3$, $BaSO_4$, MgO, $Ta_2O_5$, $HfO_2$, $Gd_2O_3$, $Nb_2O_3$, $Y_2O_3$ or contains at least one or more of these materials. For example, the radiation-reflecting particles have particle sizes ($d_{50}$ value, measured in $Q_0$) of greater than or equal to 100 nm to smaller than or equal to 300 nm, e.g., 200 nm. Such a size range for the radiation-reflecting particles has proven to be particularly advantageous for effective reflection of electromagnetic radiation having visible wavelengths. The radiation-reflecting particles are present in the base material at a concentration of greater than or equal to 10 wt. % and particularly preferred of greater than or equal to 20 wt. %. In particular, the reflecting capacity of the non-transparent connecting material 5 can be individually adjusted depending on the concentration of the radiation-reflecting particles. In the illustrated example, the non-transparent connecting material 5 appears white to an observer due to its reflective properties since the entire color spectrum of the ambient light is preferably reflected by the connecting material 5.

If the connecting material comprises a ceramic material, then this can be sintered, for example, together with the ceramic bars 91, 92, 93, 94 to form the bar composite 95. Alternatively or in addition, it is also possible to connect already sintered ceramic bars 91, 92, 93, 94 using the connecting material 5 which comprises, for example, an organic base material, e.g., silicone or epoxide.

Alternatively, it is also possible that the connecting material comprises or consists of a metallic material, for example, a metal such as Ag and/or Al or an Ag- or Al-alloy. Such metals can have good reflectivity for visible light. For example, the metallic non-transparent connecting material 5 can be applied in the form of a metal paste and then sintered together with the ceramic of the ceramic bars.

In a further method step in accordance with FIG. 1C, the bar composite 95 is severed perpendicular to the main extension direction of the ceramic bars e.g., by sawing to form individual wavelength conversion elements 10.

Figure 2:
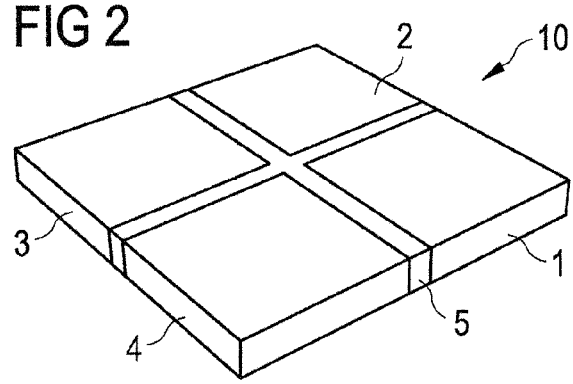
FIG. 2 shows a schematic illustration of a wavelength conversion element in accordance with a further example.

An individual wavelength conversion element 10 is shown in FIG. 2. This comprises four ceramic conversion segments 1, 2, 3, 4 produced from the ceramic bars 91, 92, 93, 94 by the separating step in accordance with FIG. 1C. The conversion segments 1, 2, 3, 4 are formed in a plate-like manner and each have a main extension plane, along which they are arranged next to each other and connect together by the non-transparent connecting material 5. As a result, the wavelength conversion element 10 is also formed in a plate-like manner. Corresponding to the provided ceramic bars 91, 92, 93, 94 in accordance with the example of FIGS. 1A to 1C, the conversion segments 1, 2, 3, 4 each comprise a ceramic wavelength conversion substance that converts blue primary radiation into red, green, yellow or blue secondary radiation. Alternatively, it is also possible to combine conversion segments with other wavelength conversion substances.

The conversion segments 1, 2, 3, 4 are formed as so-called "full conversion" segments and each have a thickness and a concentration of the respective wavelength conversion substance so that upon irradiation of primary radiation onto the conversion segments 1, 2, 3, 4, these each emit light which contains, in addition to the re-emitted secondary radiation, only a small proportion of the primary radiation of less than or equal to 5% and preferably less than or equal to 2%.

Figure 3:
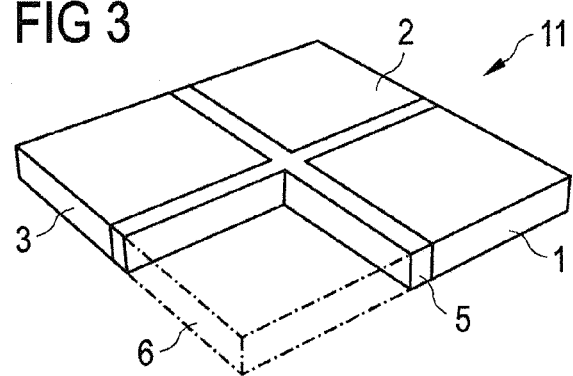
FIG. 3 shows a schematic illustration of a wavelength conversion element in accordance with a still further example.

Furthermore, it is also possible to use, instead of the method illustrated in FIGS. 1A to 1C in which four ceramic bars 91, 92, 93, 94 are joined together to form the bar composite 95, only three ceramic bars so that a wavelength conversion element 11 can be produced which, instead of a fourth conversion segment 4, comprises a transparent segment 6 formed as a recess, as illustrated by way of example in FIG. 3.

Furthermore, it is also possible to use, instead of a ceramic bar having a ceramic wavelength conversion substance, a transparent material, for example, a transparent ceramic material, for instance undoped YAG, or sapphire or glass so that the wavelength conversion element 10 can comprise a transparent segment 6 formed from the transparent material. Particularly preferably, the conversion segment 4 having the wavelength conversion substance which re-emits blue and is illustrated in FIG. 3 can be replaced by a transparent segment.

Figure 4:
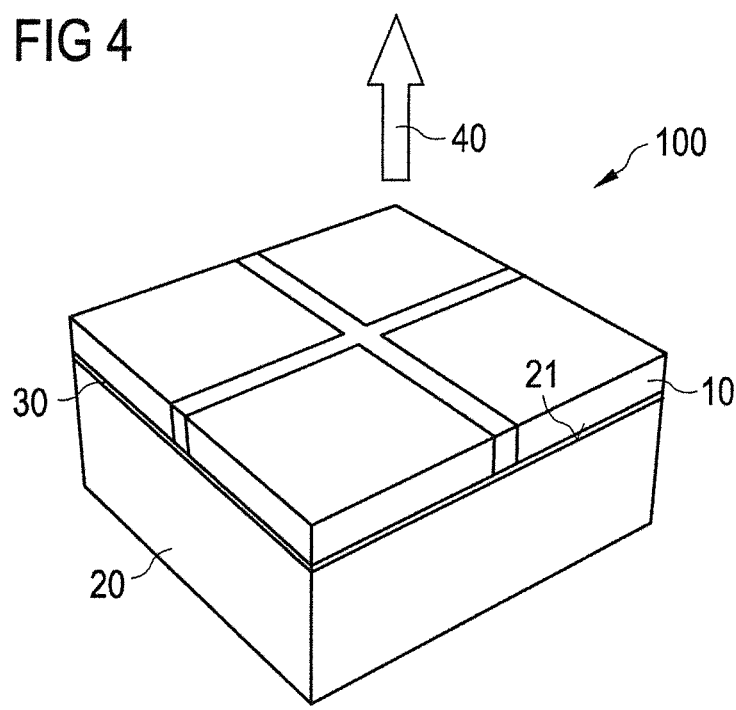
FIG. 4 shows a schematic illustration of a light-emitting semiconductor device in accordance with a yet further example.

FIG. 4 illustrates a light-emitting semiconductor device 100 in accordance with a further example comprising a wavelength conversion element 10 in accordance with the example in FIG. 2. The wavelength conversion element 10 is arranged on a light-emitting semiconductor chip 20 having a light coupling-out surface 21, via which blue primary radiation can be emitted during operation along the emitting direction 40. For this purpose, the wavelength conversion element 10 is adhered onto the light coupling-out surface 21 of the semiconductor chip 20 by a connecting layer 30, e.g., consisting of silicone. The semiconductor chip 20 has a light coupling-out surface 21 with dimensions of about 1000 μm so that the wavelength conversion element 10 produced in accordance with the method of FIGS. 1A to 1C can be arranged covering the surface of the light coupling-out surface 21.

During operation, the blue primary radiation of the semiconductor chip 20 is thus converted into the respective secondary radiation in the conversion segments 1, 2, 3, 4 of the wavelength conversion element 10. Since the conversion segments 1, 2, 3, 4 each permit full conversion, as explained in conjunction with FIG. 2, the primary radiation, in a particularly preferred manner, cannot be perceived by an observer in the light emitted by the light-emitting semiconductor device. By forming the conversion segments 1, 2, 3, 4 as full-converting conversion segments, it can thus be ensured that the thickness or thickness variations during the production of the wavelength conversion elements 10 do not result in a color variation in the case of such light-emitting semiconductor devices which are mass-produced.

With the non-transparent connecting material 5 between the conversion segments 1, 2, 3, 4, optical crosstalk between the conversion segments 1, 2, 3, 4 can be prevented. This can be advantageous particularly when the light-emitting semiconductor chip 20 comprises luminescent segments which can be actuated in a mutually independent manner and emit the primary radiation, in each case via an associated emission region of the light coupling-out surface 21, into the conversion segment 1, 2, 3, 4 disposed thereabove, wherein each of the conversion segments 1, 2, 3, 4 of the wavelength conversion element 10 is disposed in each case downstream of one of the luminescent segments of the semiconductor chip 20 in the emitting direction. By actuating the individual luminescent segments of the semiconductor chip 20 in an independent and targeted manner, the light emitted by the light-emitting semiconductor device 100 can thus be controlled in terms of its intensity and in particular in terms of its color so that the light-emitting semiconductor device 100 permits variable emission of mixed-color and/or white light. If, for example, only one luminescent segment of the semiconductor chip 20 is operated, then the light-emitting semiconductor device 100 can emit single-color light.

As a result, compared to known multi-colored light sources which are adjustable in terms of color, it is possible to use only a single semiconductor chip having primary radiation. Compared to known multi-colored, color-variable, LED-based light sources having a plurality of light-emitting diode chips, in the case of the light-emitting semiconductor device 100 described herein a lower space requirement and lower costs can be achieved.

If a metallic material is used as the non-transparent connecting material 5, then this can also effectively be used for heat dissipation of waste heat from the wavelength conversion element 10, for example, to a heat sink (not illustrated) arranged on the side.

Figure 5:
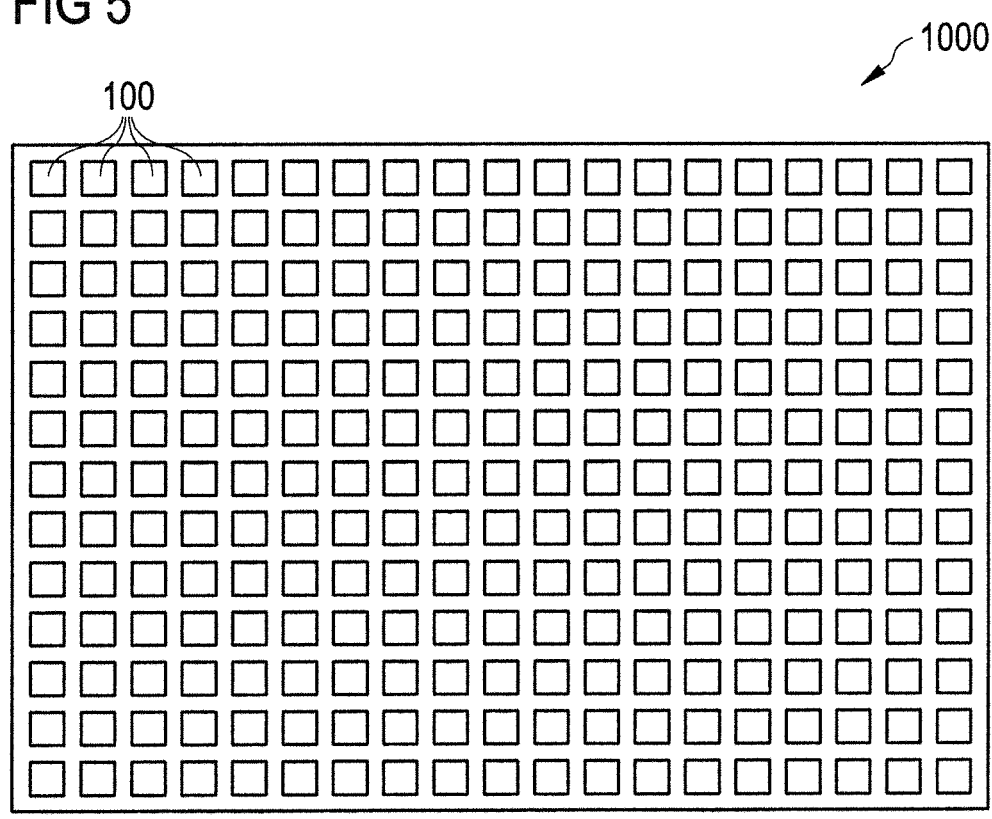
FIG. 5 shows a schematic illustration of a display apparatus in accordance with an example.

FIG. 5 illustrates a display apparatus 1000 in accordance with a further example comprising a large number of light-emitting semiconductor devices 100 in accordance with the preceding example. These are formed as individual pixels of the display apparatus 1000. If the individual light-emitting semiconductor chips 20 of the light-emitting semiconductor devices 100 comprise luminescent segments which can be actuated in a mutually separate manner, as described above, then a full-color display apparatus, e.g., a display wall is possible, which, compared to display apparatuses having conventional LED-based light sources having a plurality of light-emitting diodes, permits a higher resolution. Furthermore, the display apparatus 1000 can also comprise suitable reflectors and/or lenses, lens structures or light-scattering elements which can homogenize the light emitted from the light-emitting semiconductor devices 100 in terms of the possible perception of the individual conversion segments during operation.

My conversion elements, devices, display apparatus and methods are not limited to the examples by the description thereof. Rather, this disclosure includes any new feature and any combination of features included in particular in any combination of features in the appended claims, even if the feature or combination is not explicitly stated in the claims or examples.

The invention claimed is:

1. A wavelength conversion element comprising at least two ceramic conversion segments comprising mutually different ceramic wavelength conversion substances and connected together in a matrix by a non-transparent connecting material, wherein each conversion segment emits light by absorbing primary radiation and re-emitting secondary radiation different from the primary radiation, and the light comprises the secondary radiation and a proportion of the primary radiation is less than or equal to 5%.

2. The wavelength conversion element according to claim 1, wherein the connecting material comprises a base material formed by an organic material and/or a ceramic.

3. The wavelength conversion element according to claim 2, wherein pores or radiation-reflecting particles are arranged in the base material which have a refractive index different from that of the base material.

4. The wavelength conversion element according to claim 3, wherein the radiation-reflecting particles comprise at least one or more of the following materials: $TiO_2$, $ZrO_2$, $ZnO$, $Al_2O_3$, $BaSO_4$, $MgO$, $Ta_2O_5$, $HfO_2$, $Gd_2O_3$, $Nb_2O_3$, $Y_2O_3$.

5. The wavelength conversion element according to claim 1, wherein the connecting material is formed by a metal.

6. The wavelength conversion element according to claim 1, wherein the conversion segments are each plate-shaped with a main extension plane and are arranged next to each other along the main extension plane.

7. The wavelength conversion element according to claim 1, wherein the conversion segments absorb blue and/or ultraviolet primary radiation and the wavelength conversion element comprises at least two conversion segments, one that re-emits red secondary radiation and one that re-emits green secondary radiation.

8. The wavelength conversion element according to claim 7, wherein the wavelength conversion element comprises a conversion segment that re-emits yellow secondary radiation.

9. The wavelength conversion element according to claim 7, wherein the wavelength conversion element comprises a conversion segment that re-emits blue secondary radiation.

10. A method of producing a wavelength conversion element, the conversion element comprising at least two ceramic conversion segments each comprising a ceramic wavelength conversion substance and connected together in a matrix by a non-transparent connecting material, wherein each conversion segment emits light by absorbing primary radiation and re-emitting secondary radiation different from the primary radiation, the method comprising:
   providing at least two ceramic bars with the mutually different ceramic wavelength conversion substances, wherein the at least two bars are connected along their main extension direction by the non-transparent connecting material to form a bar composite so that the non-transparent connecting material is arranged between lateral surfaces of the bars, and
   severing the bar composite perpendicular to the main extension direction to form individual wavelength conversion elements, wherein upon severing, the conversion segments are formed from the bars.

11. The method according to claim 10, wherein the ceramic bars are sintered together with the connecting material, which comprises a ceramic or a metallic material, to form the bar composite.

12. The method according to claim 10, wherein the ceramic bars are connected, after sintering, by the connecting material, which comprises an organic material, to form the bar composite.

13. A light-emitting semiconductor device having a light-emitting semiconductor chip which during operation emits blue and/or ultraviolet primary radiation via a light coupling-out surface along an emitting direction, and having a wavelength conversion element according to claim 1, wherein the conversion segments are arranged laterally next to each other on the light coupling-out surface.

14. The semiconductor device according to claim 13, wherein the light-emitting semiconductor chip comprises luminescent segments which can be actuated in a mutually independent manner and each emit, during operation, the primary radiation via an emission region of the light coupling-out surface, and each of the conversion segments of the wavelength conversion element is disposed downstream of one of the luminescent segments in the emitting direction.

15. A display apparatus having a multiplicity of light-emitting semiconductor devices according to claim 13, wherein each of the semiconductor devices forms a pixel of the display apparatus.

* * * * *